United States Patent
Eason et al.

(10) Patent No.: US 10,147,588 B2
(45) Date of Patent: Dec. 4, 2018

(54) SYSTEM AND METHOD FOR INCREASING ELECTRON DENSITY LEVELS IN A PLASMA OF A SUBSTRATE PROCESSING SYSTEM

(71) Applicant: Lam Research Corporation, Fremont, CA (US)

(72) Inventors: Kwame Eason, East Palo Alto, CA (US); James Eugene Caron, Tracy, CA (US); Ivelin Angelov, San Jose, CA (US); Joon Hong Park, Dublin, CA (US); Dengliang Yang, Union City, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/427,163

(22) Filed: Feb. 8, 2017

(65) Prior Publication Data

US 2017/0236694 A1     Aug. 17, 2017

Related U.S. Application Data

(60) Provisional application No. 62/294,640, filed on Feb. 12, 2016.

(51) Int. Cl.
| | |
|---|---|
| *H01L 21/302* | (2006.01) |
| *H01J 37/32* | (2006.01) |
| *H01L 21/3065* | (2006.01) |

(52) U.S. Cl.
CPC ..... *H01J 37/32935* (2013.01); *H01J 37/3211* (2013.01); *H01J 37/32183* (2013.01);
(Continued)

(58) Field of Classification Search
CPC .......... H01L 21/3065; H01L 21/30621; H01L 21/3083; H01L 21/3081; H01J 2237/0656;
(Continued)

(56) References Cited

U.S. PATENT DOCUMENTS

| | | | |
|---|---|---|---|
| 4,374,698 A | 2/1983 | Sanders et al. | |
| 4,431,477 A | 2/1984 | Zajac | |

(Continued)

FOREIGN PATENT DOCUMENTS

| | | |
|---|---|---|
| EP | 0424299 A2 | 4/1991 |
| EP | 0424299 A3 | 8/1991 |

(Continued)

OTHER PUBLICATIONS

U.S. Appl. No. 62/106,407, filed Jan. 22, 2015, in the names of Joseph Yudovsky et al., & entitled "Injector for Spatially Separated Atomic Layer Deposition Chamber" pp. 1-68. (Year: 2015).

(Continued)

*Primary Examiner* — Lan Vinh

(57) ABSTRACT

A system is provided and includes a substrate processing chamber, one or more injectors, and a controller. The one or more injectors inject an electronegative gas, a baseline electropositive gas, and an additional electropositive gas into the substrate processing chamber. The electronegative gas includes an etch precursor. The additional electropositive gas mixes with and increases electron density of a plasma in the substrate processing chamber. The controller is configured to set an amount, flow rate or pressure of the additional electropositive gas based on at least one of a pressure of the electronegative gas or an electron affinity level of the additional electropositive gas.

19 Claims, 4 Drawing Sheets

(52) U.S. Cl.
 CPC .... H01J 37/32449 (2013.01); H01L 21/3065 (2013.01); *H01J 2237/0656* (2013.01); *H01J 2237/334* (2013.01)

(58) Field of Classification Search
 CPC ................. H01J 37/334; H01J 37/3211; H01J 37/32183; H01J 37/32449; H01J 37/32935
 USPC ............ 438/706, 710, 712, 714; 156/345.33, 156/345.38, 345.39
 See application file for complete search history.

(56) References Cited

U.S. PATENT DOCUMENTS

| | | | |
|---|---|---|---|
| 4,793,897 | A | 12/1988 | Dunfield et al. |
| 5,329,965 | A | 7/1994 | Gordon |
| 5,605,179 | A | 2/1997 | Strong, Jr. et al. |
| 5,662,143 | A | 9/1997 | Caughran |
| 5,744,695 | A | 4/1998 | Forbes |
| 6,042,687 | A | 3/2000 | Singh et al. |
| 6,060,400 | A | 5/2000 | Oehrlein et al. |
| 6,074,959 | A | 6/2000 | Wang et al. |
| 6,152,168 | A | 11/2000 | Ohmi et al. |
| 6,376,386 | B1 | 4/2002 | Oshima |
| 6,841,943 | B2 | 1/2005 | Vahedi et al. |
| 6,962,879 | B2 | 11/2005 | Zhu et al. |
| 7,129,171 | B2 | 10/2006 | Zhu et al. |
| 7,288,482 | B2 | 10/2007 | Panda et al. |
| 7,309,646 | B1 | 12/2007 | Heo et al. |
| 7,338,907 | B2 | 3/2008 | Li et al. |
| 7,757,541 | B1 | 7/2010 | Monkowski et al. |
| 7,758,698 | B2 | 7/2010 | Bang et al. |
| 8,137,463 | B2 | 3/2012 | Liu et al. |
| 8,552,334 | B2 | 10/2013 | Tappan et al. |
| 8,555,920 | B2 | 10/2013 | Hirata et al. |
| 8,592,328 | B2 | 11/2013 | Hausmann et al. |
| 8,889,024 | B2 | 11/2014 | Watanabe et al. |
| 8,956,980 | B1 | 2/2015 | Chen et al. |
| 9,051,647 | B2 | 6/2015 | Cooperberg et al. |
| 9,059,678 | B2 | 6/2015 | Long et al. |
| 9,318,343 | B2 | 4/2016 | Ranjan et al. |
| 9,471,065 | B2 | 10/2016 | Koyomogi et al. |
| 9,640,409 | B1 | 5/2017 | Yang et al. |
| 2001/0002581 | A1 | 6/2001 | Nishikawa et al. |
| 2001/0004903 | A1 | 6/2001 | Ohmi et al. |
| 2001/0013363 | A1 | 8/2001 | Kitayama et al. |
| 2002/0038669 | A1 | 4/2002 | Yamagishi et al. |
| 2002/0042205 | A1 | 4/2002 | McMillin et al. |
| 2002/0046991 | A1* | 4/2002 | Smith ................. H01J 27/16 219/121.57 |
| 2002/0160125 | A1 | 10/2002 | Johnson et al. |
| 2002/0174905 | A1 | 11/2002 | Latino et al. |
| 2002/0175144 | A1 | 11/2002 | Hung et al. |
| 2003/0236592 | A1 | 12/2003 | Shajii et al. |
| 2003/0236638 | A1 | 12/2003 | Shajii et al. |
| 2003/0236643 | A1 | 12/2003 | Shajii et al. |
| 2004/0094206 | A1 | 5/2004 | Ishida |
| 2004/0112538 | A1 | 6/2004 | Larson et al. |
| 2004/0112539 | A1 | 6/2004 | Larson et al. |
| 2004/0112540 | A1 | 6/2004 | Larson et al. |
| 2004/0168719 | A1 | 9/2004 | Nambu |
| 2004/0173270 | A1 | 9/2004 | Harris et al. |
| 2005/0005994 | A1 | 1/2005 | Sugiyama et al. |
| 2005/0067021 | A1 | 3/2005 | Bevers et al. |
| 2005/0155625 | A1 | 7/2005 | Jangjian et al. |
| 2005/0199342 | A1 | 9/2005 | Shajii et al. |
| 2005/0241763 | A1 | 11/2005 | Huang et al. |
| 2006/0011237 | A1 | 1/2006 | Tison et al. |
| 2006/0097644 | A1 | 5/2006 | Kono et al. |
| 2006/0124169 | A1 | 6/2006 | Mizusawa et al. |
| 2006/0207595 | A1 | 9/2006 | Ohmi et al. |
| 2006/0237063 | A1 | 10/2006 | Ding et al. |
| 2007/0026684 | A1 | 2/2007 | Parascandola et al. |
| 2007/0066038 | A1 | 3/2007 | Sadjadi et al. |
| 2007/0158025 | A1 | 7/2007 | Larson |
| 2007/0233412 | A1 | 10/2007 | Gotoh et al. |
| 2007/0240778 | A1 | 10/2007 | L'Bassi et al. |
| 2007/0259112 | A1 | 11/2007 | Ishikawa et al. |
| 2008/0115834 | A1 | 5/2008 | Geoffrion et al. |
| 2008/0121178 | A1 | 5/2008 | Bang et al. |
| 2008/0202588 | A1 | 8/2008 | Gold et al. |
| 2008/0202609 | A1 | 8/2008 | Gold et al. |
| 2008/0202610 | A1 | 8/2008 | Gold et al. |
| 2009/0061083 | A1 | 3/2009 | Chiang et al. |
| 2009/0061640 | A1 | 3/2009 | Wong et al. |
| 2009/0061644 | A1 | 3/2009 | Chiang et al. |
| 2009/0183548 | A1 | 7/2009 | Monkowski et al. |
| 2009/0183549 | A1 | 7/2009 | Monkowski et al. |
| 2009/0221117 | A1 | 9/2009 | Tan et al. |
| 2009/0272717 | A1 | 11/2009 | Pamarthy et al. |
| 2009/0320754 | A1 | 12/2009 | Oya et al. |
| 2010/0030390 | A1 | 2/2010 | Yamaguchi et al. |
| 2010/0071438 | A1 | 3/2010 | Davis et al. |
| 2010/0145633 | A1 | 6/2010 | Yasuda |
| 2010/0178770 | A1 | 7/2010 | Zin |
| 2010/0229976 | A1 | 9/2010 | Hirata et al. |
| 2010/0269924 | A1 | 10/2010 | Yasuda |
| 2011/0019332 | A1* | 1/2011 | Chistyakov ............. C23C 14/35 361/230 |
| 2011/0094596 | A1 | 4/2011 | Sugiyama et al. |
| 2011/0253225 | A1 | 10/2011 | Beeby et al. |
| 2012/0031500 | A1 | 2/2012 | Hirose et al. |
| 2012/0034786 | A1 | 2/2012 | Dhindsa et al. |
| 2012/0149213 | A1 | 6/2012 | Nittala et al. |
| 2012/0152364 | A1 | 6/2012 | Hashimoto et al. |
| 2012/0174990 | A1 | 7/2012 | Yasuda |
| 2012/0190208 | A1 | 7/2012 | Ozu et al. |
| 2012/0238102 | A1 | 9/2012 | Zhang et al. |
| 2012/0238103 | A1 | 9/2012 | Zhang et al. |
| 2012/0244715 | A1 | 9/2012 | Lebouitz et al. |
| 2012/0289057 | A1 | 11/2012 | DeDontney |
| 2012/0298221 | A1 | 11/2012 | Takeuchi et al. |
| 2013/0008607 | A1 | 1/2013 | Matsumoto et al. |
| 2013/0025715 | A1 | 1/2013 | Yamaguchi et al. |
| 2013/0029494 | A1 | 1/2013 | Sasaki et al. |
| 2013/0045605 | A1* | 2/2013 | Wang .................. H01L 21/3065 438/723 |
| 2013/0131300 | A1 | 5/2013 | Olmscheid et al. |
| 2013/0145816 | A1 | 6/2013 | Lowe |
| 2013/0220433 | A1 | 8/2013 | Sawada et al. |
| 2013/0270997 | A1* | 10/2013 | Zhao .................... H05H 1/46 315/34 |
| 2014/0080308 | A1 | 3/2014 | Chen et al. |
| 2014/0120737 | A1 | 5/2014 | Swaminathan et al. |
| 2014/0141621 | A1 | 5/2014 | Ren et al. |
| 2014/0182689 | A1 | 7/2014 | Shareef et al. |
| 2014/0248780 | A1 | 9/2014 | Ingle et al. |
| 2014/0262038 | A1 | 9/2014 | Wang et al. |
| 2015/0017810 | A1 | 1/2015 | Guha |
| 2015/0059859 | A1 | 3/2015 | Takahashi et al. |
| 2015/0287572 | A1 | 10/2015 | Daugherty et al. |
| 2016/0181116 | A1 | 6/2016 | Berry, III et al. |
| 2016/0215392 | A1 | 7/2016 | Yudovsky et al. |
| 2016/0247688 | A1 | 8/2016 | Zhu et al. |
| 2017/0032982 | A1 | 2/2017 | Drewery et al. |
| 2017/0069511 | A1 | 3/2017 | Yang et al. |
| 2017/0110335 | A1 | 4/2017 | Yang et al. |
| 2017/0200586 | A1 | 7/2017 | Treadwell et al. |
| 2017/0236694 | A1 | 8/2017 | Eason et al. |

FOREIGN PATENT DOCUMENTS

| | | |
|---|---|---|
| EP | 0838842 A2 | 4/1998 |
| WO | WO-0040776 A1 | 7/2000 |
| WO | WO-2011051251 A1 | 5/2011 |
| WO | WO-2013123617 A1 | 8/2013 |
| WO | WO-2014068886 A1 | 5/2014 |

OTHER PUBLICATIONS

U.S. Appl. No. 14/945,680, John Drewery.
U.S. Appl. No. 15/013,400, Yang et al.

(56) References Cited

OTHER PUBLICATIONS

U.S. Appl. No. 15/014,539, Yang et al.
U.S. Appl. No. 15/399,692, Treadwell et al.
U.S. Appl. No. 62/275,837, filed Jan. 7, 2016, Jason Lee Treadwell.
Bohr, Mark, "The New Era of Scaling in an SoC World" Intel Logic Technology Development; ISSCC; 2009; 66 Pages. Bohr, Mark, "The New Era of Scaling in an SoC World" Intel Logic Technology Development; ISSCC; 2009; 66 Pages.
Dusa, Mircean et al., "Pitch Doubling Through Dual Patterning Lithography Challenges in Integration and Litho Budgets," Optical Microlithography XX, vol. 6520, 65200G, (2007); 10 pages.
U.S. Office Action dated Oct. 5, 2015 issued in U.S. Appl. No. 14/576,020.
Blain et al. (Jul./Aug. 1996) "Role of nitrogen in the downstream etching of silicon nitride," Journal of Vacuum Science & Technology A, 14(4):2151-2157.
Blain (Mar./ Apr. 1999) "Mechanism of nitrogen removal from silicon nitride by nitric oxide," Journal of Vacuum Science & Technology A, 17(2):665-667.
Kastenmeier et al. (Nov./Dec. 1999) "Highly selective etching of silicon nitride over silicon and silicon dioxide," J. Vac. Sci. Technol. A, American Vacuum Society, 17 (6):3179-3184.
Kastenmeler et al. (Sep./Oct. 1996) "Chemical dry etching of silicon nitride and silicon dioxide using CF4/02/N2 gas mixtures," J. Vac. Sci. Technol. A14(5):2802-2813.
Oehrlein et al. (1996) "Study of plasma-surface interactions: chemical dry etching and high-density plasma etching," Plasma Sources Sci. Technol. 5:193-199.
Tajima et al. (2013) "Room-Temperature Si Etching in NO/F2 Gases and the Investigation of Surface Reaction Mechanisms," The Journal of Physical Chemistry C, 117:5118-5125.
Yun et al. (2007) "Large Etch Rate Enhancement by NO-Induced Surface Chemical Reaction during Chemical Dry Etching of Silicon Oxide in F2 Remote Plasmas," Journal of the Electrochemical Society, 154(4):D267-D272.
U.S. Final Ofice Action dated Feb. 26, 2016 issued in U.S. Appl. No. 14/576,020.
U.S. Office Action dated Sep. 23, 2016 issued in U.S. Appl. No. 14/576,020.
European Extended Search Report dated May 30, 2016 issued in EP 15 199 363.1.

\* cited by examiner

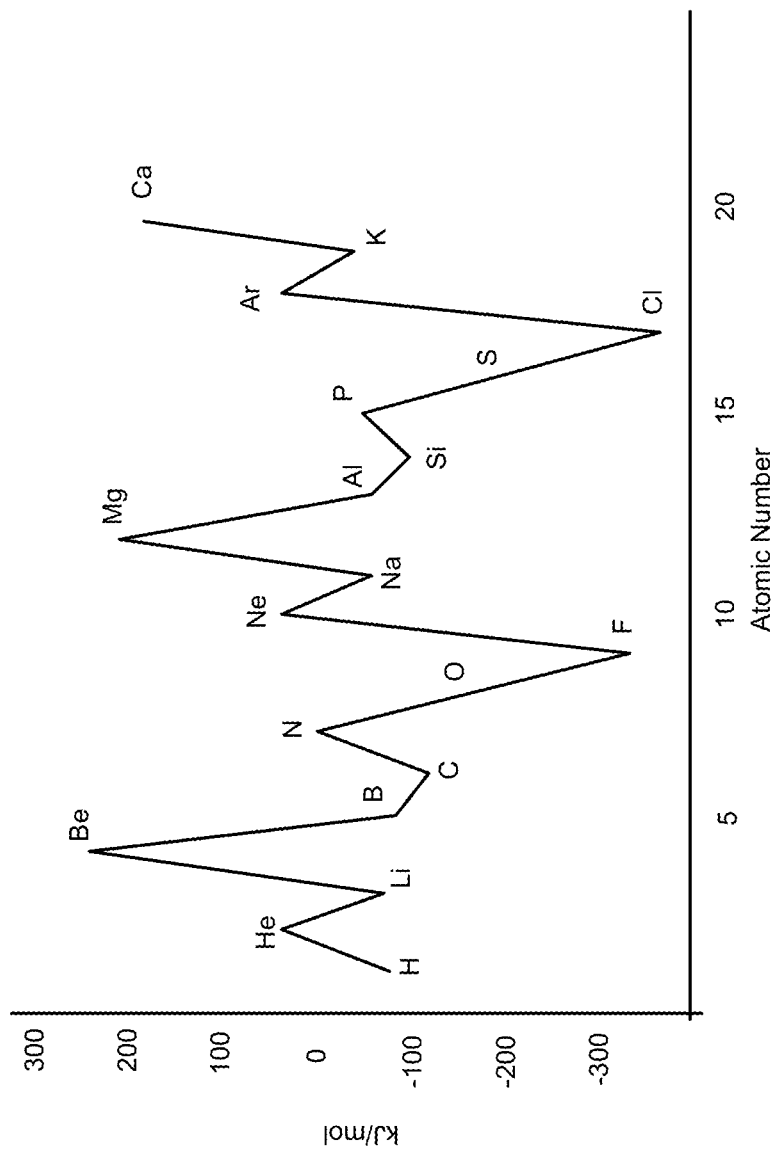

SYSTEM AND METHOD FOR INCREASING ELECTRON DENSITY LEVELS IN A PLASMA OF A SUBSTRATE PROCESSING SYSTEM

CROSS-REFERENCE TO RELATED APPLICATIONS

This application claims the benefit of U.S. Provisional Application No. 62/294,640, filed on Feb. 12, 2016. The entire disclosure of the application referenced above is incorporated herein by reference.

FIELD

The present disclosure relates to substrate processing, and more particularly to controlling electron density levels of a plasma in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to etch film on a substrate such as a semiconductor wafer. The substrate processing systems typically include a substrate processing chamber, a gas distribution device and a substrate support. During processing, the substrate is arranged on the substrate support. Different gas mixtures may be introduced into the substrate processing chamber and radio frequency (RF) plasma may be generated to activate chemical reactions. The RF plasma may include an inductively coupled plasma (ICP) or a transformer coupled plasma (TCP). The ICP or TCP may be provided by a plasma source as a result of current being supplied to charge one or more coils of the plasma source. The plasma source includes an upper portion of a substrate processing chamber and the one or more coils.

Electronegative gases, such as nitrogen trifluoride ($NF_3$), may be used to etch semiconductor films, which may be formed of silicon nitride (SiN). Use of the electronegative gases can result in non-uniform etching caused by non-uniform plasma densities (or poor plasma uniformity) within the upper portion of the substrate processing chamber. The poor plasma uniformity is due to localized generation of electrons near the coils of the plasma source and a high concentration of negative ions replacing the electrons. To improve poor plasma uniformity, a flow rate and/or pressure of the electronegative gases may be reduced. However, reduction in flow rate and/or pressure can reduce the overall performance of the etching process.

SUMMARY

A system is provided and includes a substrate processing chamber, one or more injectors, and a controller. The one or more injectors inject an electronegative gas, a baseline electropositive gas, and an additional electropositive gas into the substrate processing chamber. The electronegative gas includes an etch precursor. The additional electropositive gas mixes with and increases electron density of a plasma in the substrate processing chamber. The controller is configured to set an amount, flow rate or pressure of the additional electropositive gas based on at least one of a pressure of the electronegative gas or an electron affinity level of the additional electropositive gas.

In other features, a method is provided and includes: arranging a substrate on a substrate support within a substrate processing chamber; and injecting an electronegative gas, a baseline electropositive gas, and an additional electropositive gas into the substrate processing chamber, where the electronegative gas includes an etch precursor, and where the additional electropositive gas mixes with and increases electron density of a plasma in the substrate processing chamber. The method further include, prior to injecting the electronegative gas, the baseline electropositive gas, and the additional electropositive gas into the substrate processing chamber, setting an amount, flow rate or pressure of the additional electropositive gas based on at least one of a pressure of the electronegative gas or an electron affinity level of the additional electropositive gas. The plasma is then striked to etch the substrate.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 4 shows an example graph of electron affinities versus atomic number of certain atoms.

In the drawings, reference numbers may be reused to identify similar and/or identical elements.

DETAILED DESCRIPTION

Examples are disclosed herein for improving uniformity of plasma in a plasma source for improved etching performance of semiconductor films. The examples include increasing electron densities within a plasma of a plasma source. The added electrons tend to expand the plasma and increase overall uniformity of the plasma due to lower mass and higher mobility of the electrons than negative ions. The improved uniformity is provided without reductions in flow rate and/or pressure of the plasma. The examples are beneficial when a plasma source is operating at pressures greater than a predetermined pressure (e.g., 0.50 Torr) and while using electronegative gases.

Figure 1:
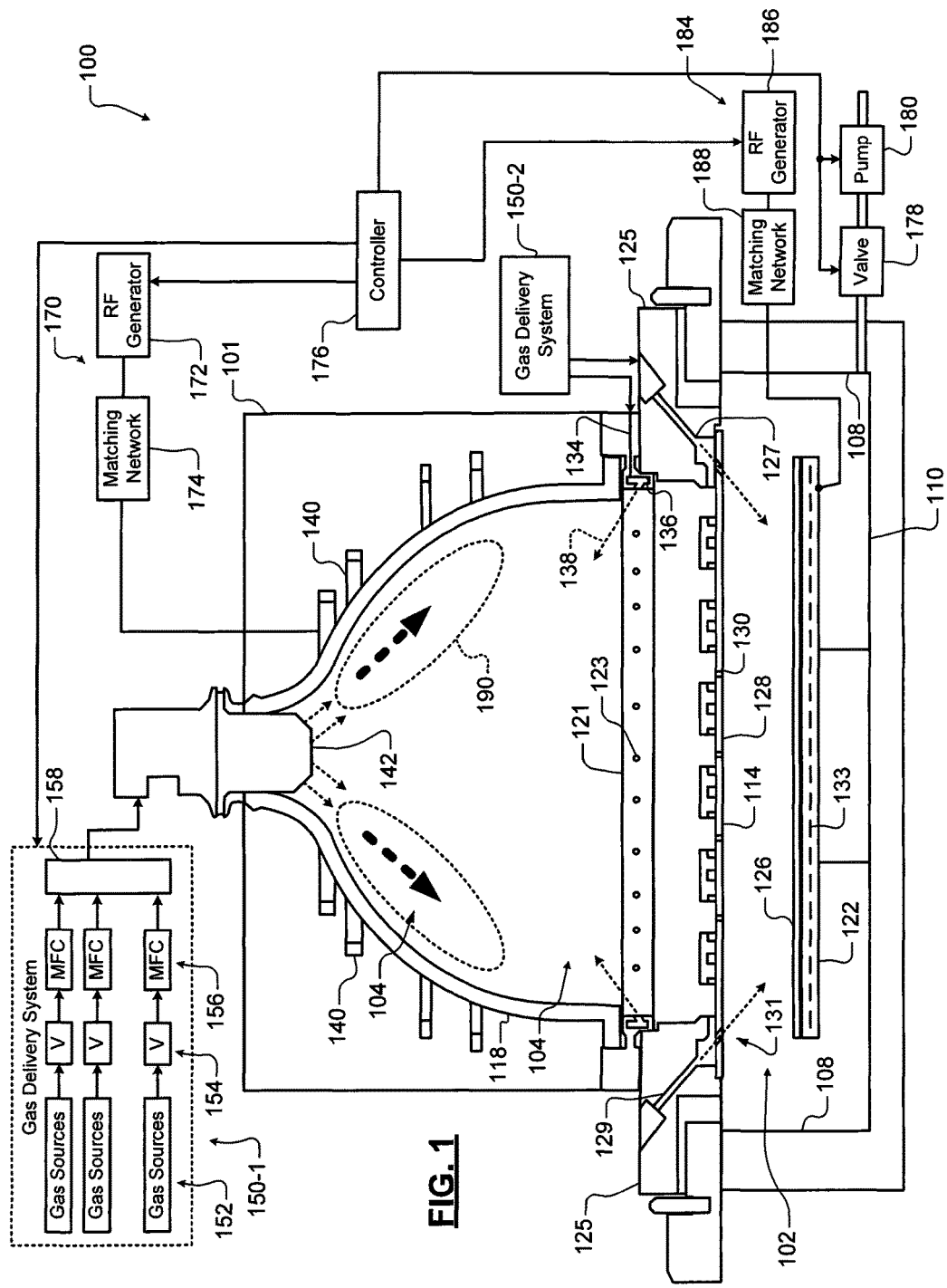
FIG. 1 is a functional block diagram of an example of a substrate processing system according to an embodiment of the present disclosure.

Referring now to FIG. 1, an example of a substrate processing system 100 with a substrate processing chamber 101 for etching a film layer of a substrate according to the present disclosure is shown. Although the substrate processing chamber 101 is shown as an ICP based system, the examples disclosed herein may be applied to a TCP based system. While a specific substrate processing chamber is shown and described, the methods described herein may be implemented on other types of substrate processing systems.

The substrate processing chamber 101 includes a lower chamber region 102 and an upper chamber region 104. The lower chamber region 102 is defined by chamber sidewall surfaces 108, a chamber bottom surface 110 and a lower surface of a gas distribution device 114. An upper portion (or dome) 118 of the substrate processing chamber 101 in combination with corresponding coils (examples of which are described below) may be referred to as a plasma source and may provide an ICP. In a TCP based system a TCP may be provided instead of ICP.

The upper chamber region 104 is defined by an upper surface of the gas distribution device 114 and an inner surface of a dome 118. In a TCP based system, the dome 118 may be replaced with a cylindrical-shaped structure. In some examples, the dome 118 rests on a first annular support 121. In some examples, the first annular support 121 includes one or more spaced holes 123 for delivering process gas to the upper chamber region 104, as will be described further below. In some examples, the process gas is delivered by the one or more spaced holes 123 in an upward direction at an acute angle relative to a plane including the gas distribution device 114, although other angles/directions may be used. In some examples, a gas flow channel 134 in the first annular support 121 supplies gas to (i) the one or more spaced holes 123, and/or (ii) one or more channels or injectors 136, which direct the gas upward (indicated by arrow 138) to mix with gas and/or plasma in the upper chamber region 104.

The first annular support 121 may be disposed above and/or on a second annular support 125. The second annular support 125 defines one or more spaced holes 127 for delivering process gas from a gas flow channel 129 to the lower chamber region 102. In some examples, holes 131 in the gas distribution device 114 align with the holes 127. In other examples, the gas distribution device 114 has a smaller diameter and the holes 131 are not needed. In some examples, the process gas is delivered by the one or more spaced holes 127 in a downward direction towards a substrate 126 at an acute angle relative to the plane including the gas distribution device 114, although other angles/directions may be used.

In other examples, the upper chamber region 104 is cylindrical with a flat top surface. In still other examples, a single chamber may be used with a spacer located between a showerhead 128 and a substrate support 122.

The substrate support 122 is arranged in the lower chamber region 102. In some examples, the substrate support 122 includes an electrostatic chuck (ESC), although other types of substrate supports can be used. A substrate 126 is arranged on an upper surface of the substrate support 122 during etching. In some examples, a temperature of the substrate 126 may be controlled by heating elements (or a heater plate) 133, an optional cooling plate with fluid channels and one or more sensors (not shown); although any other suitable substrate support temperature control system may be used.

In some examples, the gas distribution device 114 includes a showerhead (for example, a plate 128 having a plurality of spaced holes 129 is shown). The plurality of spaced holes 130 extend from the upper surface of the plate 128 to the lower surface of the plate 128. In some examples, the spaced holes 130 have a diameter in a range from 0.4" to 0.75" and the showerhead is made of a conducting material such as aluminum or a non-conductive material such as ceramic with an embedded electrode made of a conducting material.

One or more inductive coils 140 may be arranged around an outer portion of the dome 118. When energized, the one or more inductive coils 140 create an electromagnetic field inside of the dome 118. In some examples, an upper coil and a lower coil are used. A gas injector 142 injects one or more gas mixtures from a gas delivery system 150-1. Each of the gas mixtures may include (i) one or more electronegative gases and/or electronegative gas compounds, and (ii) one or more electropositive gases and/or electropositive gas compounds.

In some examples, a gas delivery system 150-1 includes one or more gas sources 152, one or more valves 154, one or more mass flow controllers (MFCs) 156, and a mixing manifold 158, although other types of gas delivery systems may be used. A gas splitter (not shown) may be used to vary flow rates of a gas mixture. Another gas delivery system 150-2 may be used to supply an etch gas or an etch gas mixture to the gas flow channels 129 and/or 134 (in addition to or instead of etch gas from the gas injector 142).

Suitable gas delivery systems are shown and described in commonly assigned U.S. patent application Ser. No. 14/945,680, entitled "Gas Delivery System" and filed on Dec. 4, 2015, which is hereby incorporated by reference in its entirety. Suitable single or dual gas injectors and other gas injection locations are shown and described in commonly assigned U.S. Provisional Patent Application Ser. No. 62/275,837, entitled "Substrate Processing System with Multiple Injection Points and Dual Injector" and filed on Jan. 7, 2016, which is hereby incorporated by reference in its entirety.

In some examples, the gas injector 142 includes a center injection location that directs gas in a downward direction and one or more side injection locations that inject gas at an angle with respect to the downward direction. In some examples, the gas delivery system 150-1 delivers a first portion of the gas mixture at a first flow rate to the center injection location and a second portion of the gas mixture at a second flow rate to the side injection location(s) of the gas injector 142. In other examples, different gas mixtures are delivered by the gas injector 142. In some examples, the gas delivery system 150-1 delivers tuning gas to the gas flow channels 129 and 134 and/or to other locations in the processing chamber as will be described below.

A plasma generator 170 may be used to generate RF power that is output to the one or more inductive coils 140. Plasma 190 is generated in the upper chamber region 104. In some examples, the plasma generator 170 includes an RF generator 172 and a matching network 174. The matching network 174 matches an impedance of the RF generator 172 to the impedance of the one or more inductive coils 140. In some examples, the gas distribution device 114 is connected to a reference potential such as ground. A valve 178 and a pump 180 may be used to control pressure inside of the lower and upper chamber regions 102, 104 and to evacuate reactants.

A controller 176 communicates with the gas delivery systems 150-1 and 150-2, the valve 178, the pump 180, and/or the plasma generator 170 to control flow of process gas, purge gas, RF plasma and chamber pressure. In some examples, plasma is sustained inside the dome 118 by the one or more inductive coils 140. One or more gas mixtures are introduced from a top portion of the substrate processing chamber 101 using the gas injector 142 (and/or holes 123) and plasma is confined within the dome 118 using the gas distribution device 114.

Confining the plasma in the dome 118 allows volume recombination of plasma species and effusing desired etchant species through the gas distribution device 114. In some examples, there is no RF bias applied to the substrate 126. As a result, there is no active sheath on the substrate 126 and ions are not hitting the substrate 126 with any finite energy. Some amount of ions will diffuse out of the plasma region through the gas distribution device 114. However, the amount of plasma that diffuses is an order of magnitude lower than the plasma located inside the dome 118. Most of ions in the plasma are lost by volume recombination at high pressures. Surface recombination loss at the upper surface of the gas distribution device 114 also lowers ion density below the gas distribution device 114.

In other examples, the substrate processing system 100 includes an RF bias generator 186 and a matching network 188. The RF bias generator 186 generates a RF bias that can be used to create plasma between the gas distribution device 114 and the substrate support 122 or to create a self-bias on the substrate 126 to attract ions. The controller 176 may control the RF bias. The output frequencies of the RF bias generator 186 and/or the matching network 188 may be 0.5-60 mega-hertz (MHz).

Although the substrate processing system 100 is primarily described as operating with an ICP or TCP source, the substrate processing system 100 may also or alternatively operate as a capacitively-coupled plasma (CCP) reactor and/or a parallel plate reactor, where a RF electrode of the substrate support 122 serves as a lower plate and the showerhead 128 or the upper portion 118 serves as the upper plate depending on whether the showerhead 128 is included.

Figure 2:
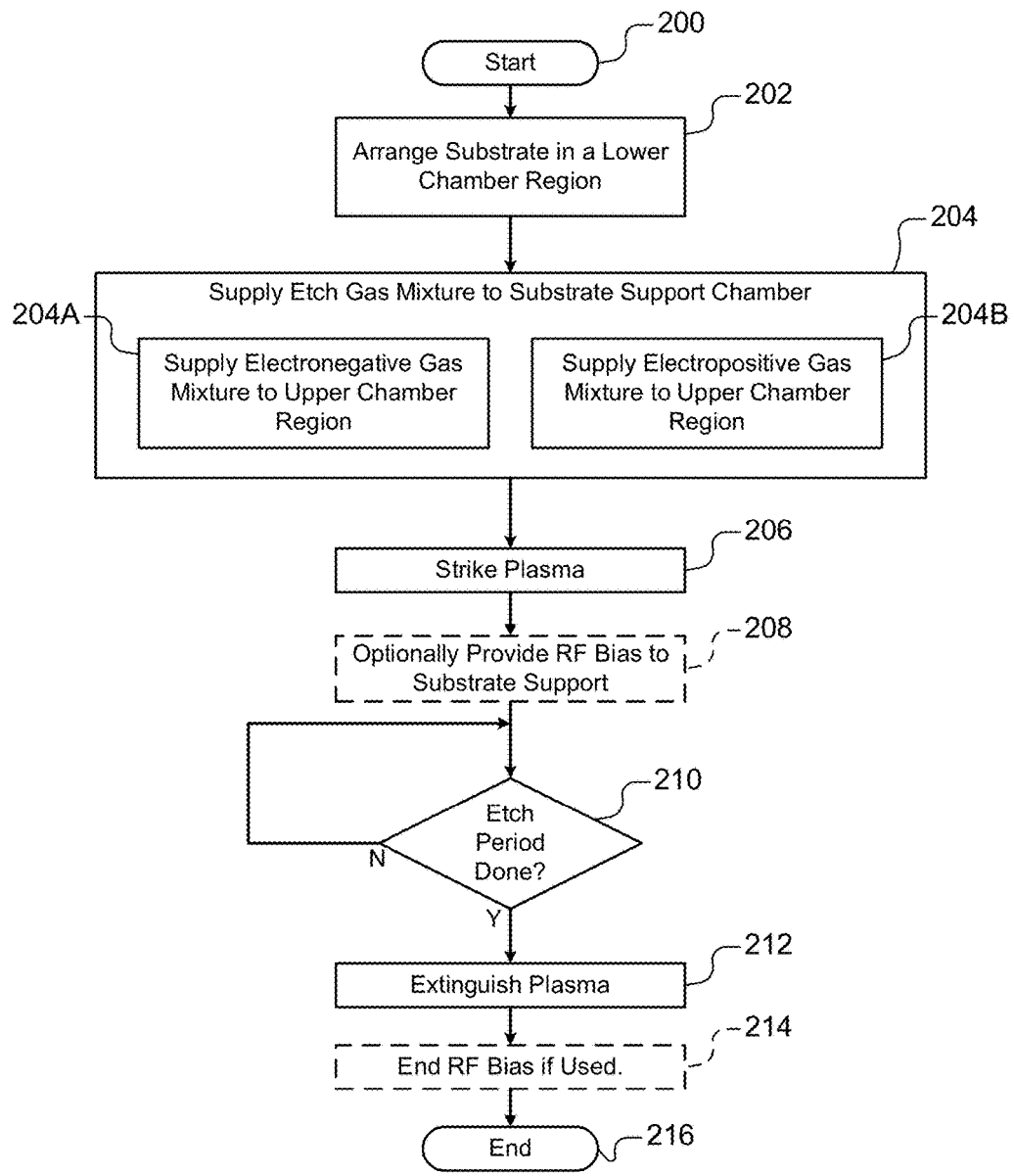
FIG. 2 illustrates an example method of operating the substrate processing system.

For further defined structure of the controller and/or other devices of the substrate processing system 100 of FIG. 1 see below provided method of FIG. 2 and below provided definition for the term "controller". The substrate processing system 100 may be operated using numerous methods, an example method is illustrated in FIG. 2. In FIG. 2, a method of operating a substrate processing system is shown. Although the following tasks are primarily described with respect to the implementations of FIG. 1, the tasks may be easily modified to apply to other implementations of the present disclosure. The tasks may be iteratively performed.

The method may begin at 200. At 202, a substrate is arranged on the substrate support 122 in the lower chamber region 102. The substrate may include multiple layers including one or more film layers. The one or more film layers may include a semiconductor film layer formed of SiN.

At 204, one or more etch gases and/or one or more etch gas mixtures is provided by the gas delivery system 150-1 and/or 150-2 via the gas injector 142 to the upper chamber region 104. The etch gas mixture may be provided at a high pressure (e.g., greater than 0.5 Torr). The etch gas mixture includes an etch precursor, such as carbon tetrafluoride ($CF_4$), sulfur hexafluoride ($SF_6$), nitrogen trifluoride ($NF_3$) and/or other etch precursor. The etch gas mixture and/or the etch precursor includes one or more electronegative gases (or gases that capture free electrons and form negative ions).

The etch gas mixture may include (i) a baseline amount of electropositive gas (e.g., a baseline amount of $N_2O$ and/or H), and (ii) either no additional electropositive gas or additional electropositive gas(es). The amount, flow rate, and/or pressure of additional electropositive gas(es) supplied may be predetermined and/or determined by the controller 176 based on: the application; the types of gases and/or compound gases supplied; the pressures of the gases (electronegative and/or electropositive) supplied; a predetermined maximum electron affinity level of the additional electropositive gas(es); electron affinity levels of the gases (electronegative and/or electropositive) supplied; which ones of the gas delivery systems 150-1, 150-2 are supplying the gases; and/or which gas is being supplied by each of the gas delivery systems 150-1, 150-2. The pressures of the additional electropositive gas(es) may be the same as the pressures of the electronegative gas(es) and baseline electropositive gas(es). An electron affinity level may be defined as an amount of energy released or spent when an electron is added to a neutral atom or molecule in the gaseous state to form a negative ion.

The additional electropositive gas(es) include (i) one or more electropositive gases (or gases having the ability to donate electrons), and/or (ii) a gas mixture including a high concentration (greater than a predetermined concentration level) of an electropositive gas. The electropositive gases have a low electron affinity (e.g., less than a predetermined electron affinity level). As an example, the etch gas mixture without any additional electropositive gas may be 5% electronegative gas and 95% electropositive gas. The percentage of electronegative gas is decreased relative to the total overall amount of gas supplied when additional electropositive gas is supplied. The percentage of the electronegative gas may be reduced to within a predetermined range of 0%. The additional electropositive gas(es) may be different than the baseline electropositive gas(es). The additional electropositive gas(es) may be more electropositive than and thus less likely to gain an electron than the baseline electropositive gas(es). The electronegative gases and/or the electropositive gases may be provided at a high pressure (e.g., greater than 0.5 Torr). The higher the pressures of the gases, the more additional electropositive gas supplied relative to (i) the amount of electronegative gas and baseline electropositive gas supplied within a predetermined period of time, and/or (ii) the total overall amount of gas supplied within the predetermined period of time. This decreases the overall percentage of electronegative gas within the substrate processing chamber 101.

Each of the etch precursor/electronegative gas(es), the baseline electropositive gas(es), and the additional electropositive gas(es) may be provided via the first gas delivery system 150-1 and/or the second gas delivery system 150-2. In one embodiment, the etch precursor/electronegative gas(es), the baseline electropositive gas(es), and the additional electropositive gas(es) are provided via the first gas delivery system 150-1 and not via the second gas delivery system 150-2. In this example embodiment, the additional electropositive gases may mix with the other gases prior to the injector 142, in the injector 142, and/or in the substrate processing chamber 101. In another embodiment, the etch precursor/electronegative gas(es) and the baseline electropositive gas(es) are provided via the first gas delivery system 150-1 and the additional electropositive gas(es) are provided via the second gas delivery system 150-2. In this example embodiment, the additional electropositive gases may mix with the other gases in the substrate processing chamber 101.

In yet another embodiment, the etch precursor/electronegative gas(es), the baseline electropositive gas(es), and the additional electropositive gases are each provided via both of the gas delivery systems 150-1, 150-2. In this example embodiment, the additional electropositive gases may mix with the other gases prior to be injected into the substrate processing chamber 101 and/or in the substrate processing chamber 101. In another embodiment, the etch precursor/electronegative gas(es) are provided via the second gas delivery system 150-2 and the additional electropositive gases are provided via the first gas delivery system 150-1. In this example embodiment, the additional electropositive gases may mix with the other gases in the substrate processing chamber 101.

Figure 3:
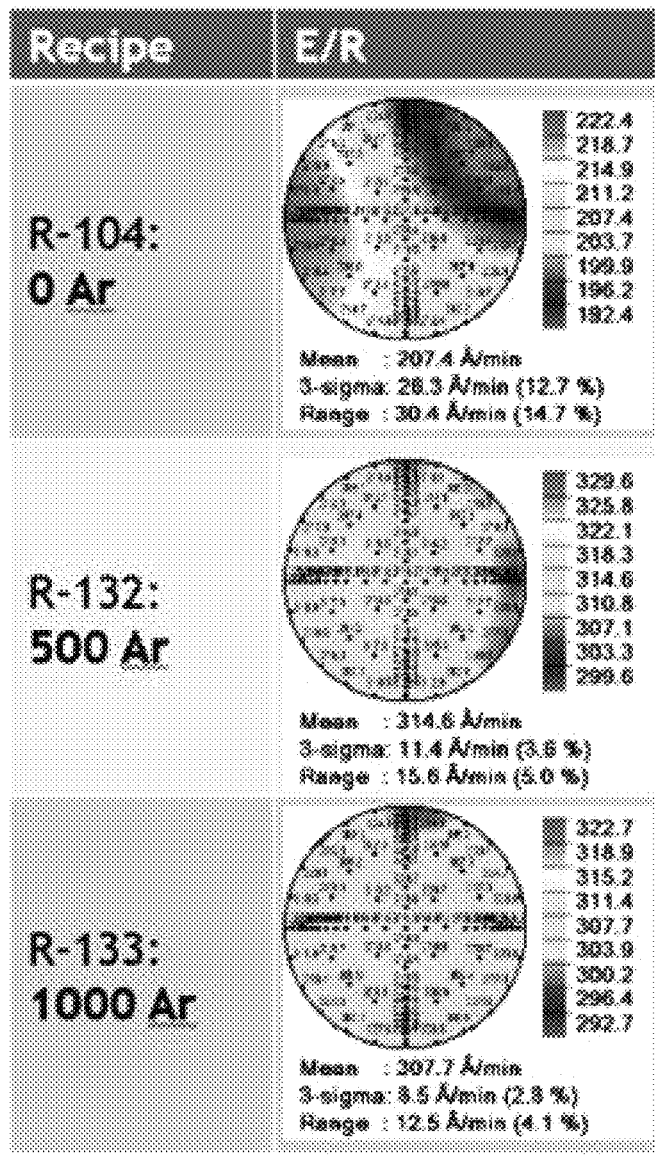
FIG. 3 is a series of plots illustrating plasma etch rate uniformity levels for different concentration levels of electropositive gases supplied.

The additional electropositive gases may include an inert gas (a gas having a complete outer electron shell), a non-inert gas, an inert gas compound, and/or a non-inert gas compound. The inert gas and/or the inert gas compound may include a noble gas (e.g., argon). The additional electropositive gases have low electron affinity (or an electron affinity of less than a predetermined level). FIG. 3 illustrates increased plasma etch rate uniformity levels based on corresponding concentration levels of argon gas provided. A first plot illustrates a plasma etch rate uniformity level of 14.7% when the concentration level of argon is 0. A second plot illustrates a plasma etch rate uniformity level of 5.0% when the concentration level of argon is 500 standard cubic centimeters per minute (sccm). A third plot illustrates a plasma etch rate uniformity level of 4.1% when the concentration level of argon is 1000 sccm. Each of the uniformity levels refers to a variance (or range) from a mean etch rate, where the mean etch rate is provided in angstroms per minute (Å/min).

To increase plasma uniformity within the substrate processing chamber 101, electron density is increased by supplying the additional electropositive gases. This increases a concentration of atoms and/or molecules with low electron affinity into a plasma in the substrate processing chamber 101. To increase the concentration of atoms and/or molecules with low electron affinity, predetermined amounts of one or more preselected electropositive gases and/or gas compounds are added to the plasma. The additional electropositive gases are selected to minimize any negative impacts on substrate process results. In one embodiment, an inert gas such as argon is added to the gas chemistry of the plasma to increase the electron density and uniformity of the plasma. In another example embodiment, a non-inert gas is added to the gas chemistry of the plasma. The non-inert gas may contribute to providing requested and/or required process results while at the same time increasing the electron density and uniformity of the plasma.

The controller 176 may control the amounts and timing of the gases provided via the gas delivery systems 150-1, 150-2. The controller 176 may control operation of the mass flow controllers 156 to control concentration levels of the gases provided to the injector 142.

Table 1 below lists the electron affinities of different atoms, radicals and molecules. Chart 1 shows electron affinities of certain atoms. The graph of FIG. 4 shows electron affinities versus atomic number of certain atoms. One or more of the atoms, radicals and/or molecules in table 1, chart 1 and/or the graph of FIG. 4 may be included in the one or more electropositive gases depending on: the application; the types of gases (e.g., electronegative and/or electropositive) supplied; a predetermined maximum electron affinity level of the additional electropositive gas(es) supplied; pressures of the gases supplied; electron affinity levels of the gases (e.g., electronegative and/or electropositive gases) supplied; which ones of the gas delivery systems 150-1, 150-2 are supplying the gases; and/or which gas is being supplied by each of the gas delivery systems 150-1, 150-2. Tables, charts, graphs and/or equations for relating and determining parameters and/or values described herein may be stored in memory of and/or accessible to the controller 176 of FIG. 1.

TABLE 1

Electron Affinities for Certain Atoms, Radicals, and Molecules

| Atom, Radical, or Molecule | Electron Affinity in electron Volts (eV) | Atom, Radical, or Molecule | Electron Affinity in electron Volts (eV) |
|---|---|---|---|
| $H^- = H + e$ | 0.75 | $O^- = O + e$ | 1.5 |
| $S^- = S + e$ | 2.1 | $F^- = F + e$ | 3.4 |
| $Cl^- = Cl + e$ | 3.6 | $O2^- = O2 + e$ | 0.44 |
| $O_3^- = O_3 + e$ | 2.0 | $HO2^- = HO2 + e$ | 3.0 |
| $OH^- = OH + e$ | 1.8 | $Cl_2^- = Cl_2 + e$ | 2.4 |
| $F_2^- = F_2 + e$ | 3.1 | $SF_5^- = SF_5 + e$ | 3.2 |
| $SF_6^- = SF_6 + e$ | 1.5 | $SO_2^- = SO_2 + e$ | 1.2 |
| $NO^- = NO + e$ | 0.024 | $NO_2^- = NO_2 + e$ | 3.1 |
| $NO_3^- = NO_3 + e$ | 3.9 | $N_2O^- = N_2O + e$ | 0.7 |
| $HNO_3^- = HNO_3 + e$ | 2.0 | $NF_2^- = NF_2 + e$ | 3.0 |
| $CH_3^- = CH_3 + e$ | 1.1 | $CH_2^- = CH_2 + e$ | 1.5 |
| $CF_3^- = CF_3 + e$ | 2.1 | $CF_2^- = CF_2 + e$ | 2.7 |
| $CCl_4^- = CCl_4 + e$ | 2.1 | $SiH_3^- = SiH_3 + e$ | 2.7 |
| $UF_6^- = UF_6 + e$ | 2.9 | $PtF_6^- = PtF_6 + e$ | 6.8 |
| $Fe(CO)_4^- = Fe(CO)_4 + e$ | 1.2 | $TiCl_4^- = TiCl_4 + e$ | 1.6 |

CHART 1

Electron Affinities in kilo-joules per mole (kJ/mol)

| 1A | 2A | 3A | 4A | 5A | 6A | 7A | 8A |
|---|---|---|---|---|---|---|---|
| H | | | | | | | He |
| -73 | | | | | | | >0 |
| Li | Be | B | C | N | O | F | Ne |
| -60 | >0 | -27 | -122 | >0 | -141 | -328 | >0 |
| Na | Mg | Al | Si | P | S | Cl | Ar |
| -53 | >0 | -43 | -134 | -72 | -200 | -349 | >0 |
| K | Ca | Ga | Ge | As | Se | Br | Kr |
| -48 | -2 | -30 | -119 | -78 | -195 | -325 | >0 |
| Rb | Sr | In | Sn | Sb | Te | I | Xe |
| -47 | -5 | -30 | -107 | -103 | -190 | -295 | >0 |

At 206, the plasma is struck in the upper chamber region 104. At 208, an RF bias is optionally supplied to the substrate support via the RF generator 186 and matching network 188. At 210, the controller 176 may determine whether a predetermined etch period has ended. If the etch period has ended, task 212 is performed. At 212, the plasma is extinguished when the predetermined etch period ends. At 214, the RF bias is terminated if used. The method may end at 216.

The above-described tasks are meant to be illustrative examples; the tasks may be performed sequentially, synchronously, simultaneously, continuously, during overlapping time periods or in a different order depending upon the application. Also, any of the tasks may not be performed or skipped depending on the implementation and/or sequence of events.

The above-described method includes etching semiconductor films using an electronegative gas chemistry at high pressure and adding a high concentration of an electropositive gas with a low electron affinity to the process chemistry. The above-described method provides higher electron densities and improved uniformity at high pressures. The advantage of this is that the process uniformity of a semiconductor etching process operating with electronegative gases at a relatively high pressure (e.g., greater than 0.5 Torr) is improved. Electropositive gases are added to the plasma to improve uniformity. This is different than the traditional approach of decreasing pressures to stabilize plasma.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A system for increasing electron density levels in a plasma, the system comprising:
   a substrate processing chamber;
   one or more injectors that inject an electronegative gas, a baseline electropositive gas, and an additional electropositive gas into the substrate processing chamber, wherein the electronegative gas includes an etch precursor, and wherein the additional electropositive gas mixes with and increases electron density of a plasma in the substrate processing chamber; and a controller configured to set an amount, flow rate or pressure of the additional electropositive gas based on at least one of a pressure of the electronegative gas or an electron affinity level of the additional electropositive gas, wherein the controller is configured to decrease a percentage of the electronegative gas relative to a total amount of gas supplied to the substrate processing chamber when (i) the additional electropositive gas is supplied, and (ii) a total amount of electropositive gas is increased.

2. The system of claim 1, wherein the controller is configured to adjust an amount of the additional electropositive gas injected into the substrate processing chamber, wherein the controller sets a concentration level of the additional electropositive gas to be greater than 0% and less than 5%.

3. The system of claim 1, wherein the controller is configured to adjust concentration levels of the electronegative gas, the baseline gas, and the additional electropositive gas based on the electron affinity level of the additional electropositive gas.

4. The system of claim 1, wherein the electronegative gas is provided to the substrate processing chamber at a pressure greater than 0.5 Torr.

5. The system of claim 1, wherein the additional electropositive gas is provided to the substrate processing chamber at a pressure greater than 0.5 Torr.

6. The system of claim 1, wherein the additional electropositive gas includes an inert gas.

7. The system of claim 1, wherein the additional electropositive gas includes a non-inert gas.

8. The system of claim 1, wherein the additional electropositive gas has a lower electron affinity than the baseline electropositive gas.

9. The system of claim 1, wherein a pressure of the additional electropositive gas is a same pressure as the electronegative gas and a pressure of the baseline electropositive gas.

10. The system of claim 1, wherein a flow rate of the plasma is not reduced while (i) the percentage of the electronegative gas relative to the total amount of gas supplied to the substrate processing chamber is decreased, and (ii) a percentage of an overall amount of electropositive gas relative to the total amount of gas supplied to the substrate processing chamber is increased.

11. The system of claim 1, wherein a flow rate of the plasma is maintained at a same flow rate while (i) the percentage of the electronegative gas relative to the total amount of gas supplied to the substrate processing chamber is decreased, and (ii) a percentage of an overall amount of electropositive gas relative to the total amount of gas supplied to the substrate processing chamber is increased.

12. A method comprising:
arranging a substrate on a substrate support within a substrate processing chamber;
injecting an electronegative gas, a baseline electropositive gas, and an additional electropositive gas into the substrate processing chamber, wherein the electronegative gas includes an etch precursor, wherein the additional electropositive gas mixes with and increases electron density of a plasma in the substrate processing chamber, and
wherein prior to injecting the electronegative gas, the baseline electropositive gas, and the additional electropositive gas into the substrate processing chamber, setting an amount, flow rate or pressure of the additional electropositive gas based on at least one of a pressure of the electronegative gas or an electron affinity level of the additional electropositive gas;
decreasing a percentage of the electronegative gas relative to a total amount of gas supplied to the substrate processing system when (i) the additional electropositive gas is supplied, and (ii) a total amount of electropositive gas is increased; and
striking the plasma to etch the substrate.

13. The method of claim 12, further comprising:
adjusting an amount of the additional electropositive gas injected into the substrate processing chamber; and
setting a concentration level of the additional electropositive gas to be greater than 0% and less than 5%.

14. The method of claim 12, further comprising adjusting concentration levels of the electronegative gas, the baseline gas, and the additional electropositive gas based on the electron affinity level of the additional electropositive gas.

15. The method of claim 12, wherein the electronegative gas is provided to the substrate processing chamber at a pressure greater than 0.5 Torr.

16. The method of claim 12, wherein the additional electropositive gas is provided to the substrate processing chamber at a pressure greater than 0.5 Torr.

17. The method of claim 12, wherein the additional electropositive gas includes an inert gas.

18. The method of claim 12, wherein the additional electropositive gas includes a non-inert gas.

19. The method of claim 12, wherein the additional electropositive gas has a lower electron affinity than the baseline electropositive gas.

* * * * *